(12) United States Patent
Villanueva et al.

(10) Patent No.: US 6,750,546 B1
(45) Date of Patent: Jun. 15, 2004

(54) FLIP-CHIP LEADFRAME PACKAGE

(75) Inventors: Robbie U. Villanueva, Rancho Santa Margarita, CA (US); Mahyar S. Dadkhah, Harvard, MA (US); Hassan S. Hashemi, Laguna Niguel, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/013,023

(22) Filed: Nov. 5, 2001

(51) Int. Cl.$^7$ .............................. H01K 1/14; H05K 7/02; H01L 23/498; H01L 23/12

(52) U.S. Cl. .................. 257/778; 257/737; 257/738; 257/680; 257/774; 257/772; 257/691; 257/696; 257/698; 257/779; 257/666; 257/797; 257/673; 361/749; 361/776; 361/783

(58) Field of Search .................. 257/778, 734, 257/738, 737, 680, 774, 772, 691, 696, 698, 779, 666, 797, 673, 238, 729, 784, 786, 693, 692, 728, 725, 690; 361/749, 776, 783

(56) References Cited

U.S. PATENT DOCUMENTS

| | | | | |
|---|---|---|---|---|
| 4,135,168 A | * | 1/1979 | Wade | |
| 5,298,460 A | * | 3/1994 | Nishiguchi et al. | 228/180.22 |
| 5,459,368 A | * | 10/1995 | Onishi et al. | 310/344 |
| 5,607,099 A | * | 3/1997 | Yeh et al. | 228/180.22 |
| 5,764,832 A | * | 6/1998 | Tabuchi | 385/49 |
| 5,926,694 A | * | 7/1999 | Chigawa et al. | 438/106 |
| 5,998,509 A | * | 12/1999 | Hayase et al. | 523/425 |
| 6,018,249 A | * | 1/2000 | Akram et al. | 324/758 |
| 6,084,781 A | * | 7/2000 | Klein | 361/777 |
| 6,097,089 A | * | 8/2000 | Gaku et al. | 257/712 |
| 6,166,436 A | * | 12/2000 | Maeda et al. | 257/723 |
| 6,208,156 B1 | * | 3/2001 | Hembree | 324/755 |
| 6,214,716 B1 | * | 4/2001 | Akram | 438/612 |
| 6,261,871 B1 | * | 7/2001 | Langari et al. | 438/124 |
| 6,281,450 B1 | * | 8/2001 | Urasaki et al. | 257/777 |
| 6,285,203 B1 | * | 9/2001 | Akram et al. | 324/755 |
| 6,288,451 B1 | * | 9/2001 | Tsao | 257/778 |
| 6,426,642 B1 | * | 7/2002 | Akram et al. | 257/730 |
| 6,495,394 B1 | * | 12/2002 | Nakata et al. | 438/107 |
| 6,498,392 B2 | * | 12/2002 | Azuma | 257/676 |
| 6,507,104 B2 | * | 1/2003 | Ho et al. | 257/712 |
| 6,509,647 B2 | * | 1/2003 | Akram et al. | 257/738 |
| 6,510,976 B2 | * | 1/2003 | Hwee et al. | 228/180.22 |
| 6,512,031 B1 | * | 1/2003 | Honda et al. | 524/115 |
| 6,534,855 B1 | * | 3/2003 | Ahn et al. | 257/698 |
| 6,580,165 B1 | * | 6/2003 | Singh | 257/696 |
| 2001/0008250 A1 | * | 7/2001 | Hembree | 228/257 |
| 2001/0020736 A1 | * | 9/2001 | Nakazawa et al. | 257/678 |
| 2002/0033378 A1 | * | 3/2002 | Hayashi et al. | 216/11 |
| 2002/0076851 A1 | * | 6/2002 | Eden et al. | 438/106 |
| 2002/0121706 A1 | * | 9/2002 | Tatsuta et al. | 257/778 |
| 2002/0135064 A1 | * | 9/2002 | Hazeyama et al. | 257/737 |
| 2002/0140065 A1 | * | 10/2002 | Paek | 257/673 |
| 2003/0141885 A1 | * | 7/2003 | Akram et al. | 324/754 |

FOREIGN PATENT DOCUMENTS

| | | | |
|---|---|---|---|
| JP | 4-328857 | * | 11/1992 |
| JP | 11-121494 | * | 4/1999 |

* cited by examiner

*Primary Examiner*—Alexander Oscar Williams
(74) *Attorney, Agent, or Firm*—Farjami & Farjami LLP

(57) ABSTRACT

A leadframe includes at least one peripheral lead secured to a paddle. A paddle solder bump pad and a peripheral solder bump pad are respectively situated on the at least one peripheral lead and the paddle. A first recess is adjacent to the paddle solder bump pad and a second recess is adjacent to the peripheral solder bump pad. A semiconductor die having at least first and second solder bumps is situated on the leadframe such that the first solder bump is soldered to the paddle solder bump pad while the second solder bump is soldered to the peripheral solder bump pad. The first and second recesses adjacent to respectively the paddle solder bump pad and the peripheral solder bump pad prevent solder from flowing out of the solder bump pad areas during solder reflow process. In this manner, the potential shorting of adjacent solder bump pads is prevented.

29 Claims, 3 Drawing Sheets

Figur 1A (Prior Art)
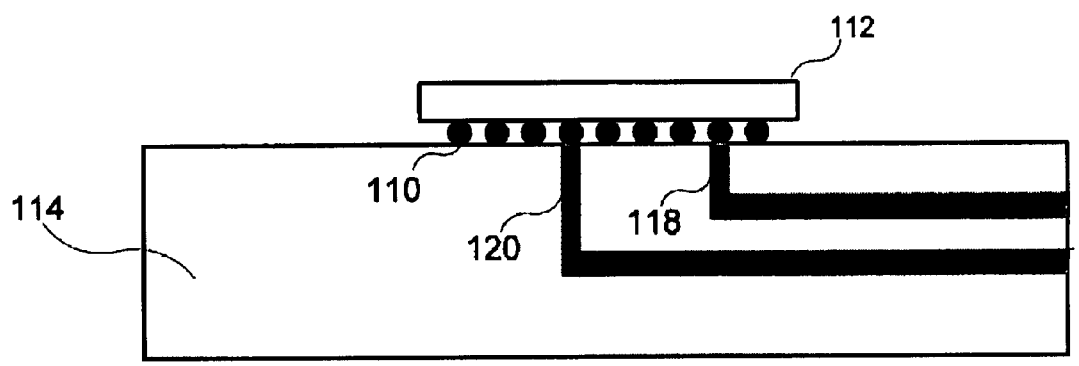
Figure 1B (Prior Art)
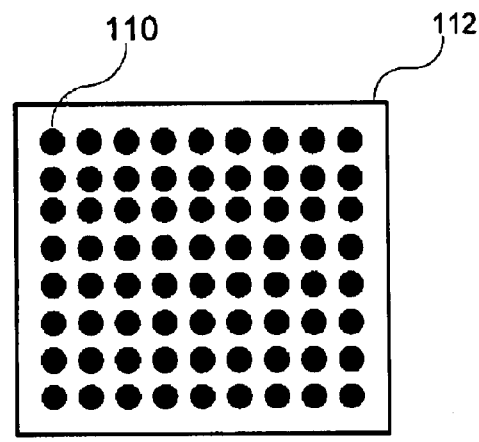

Figur 3A
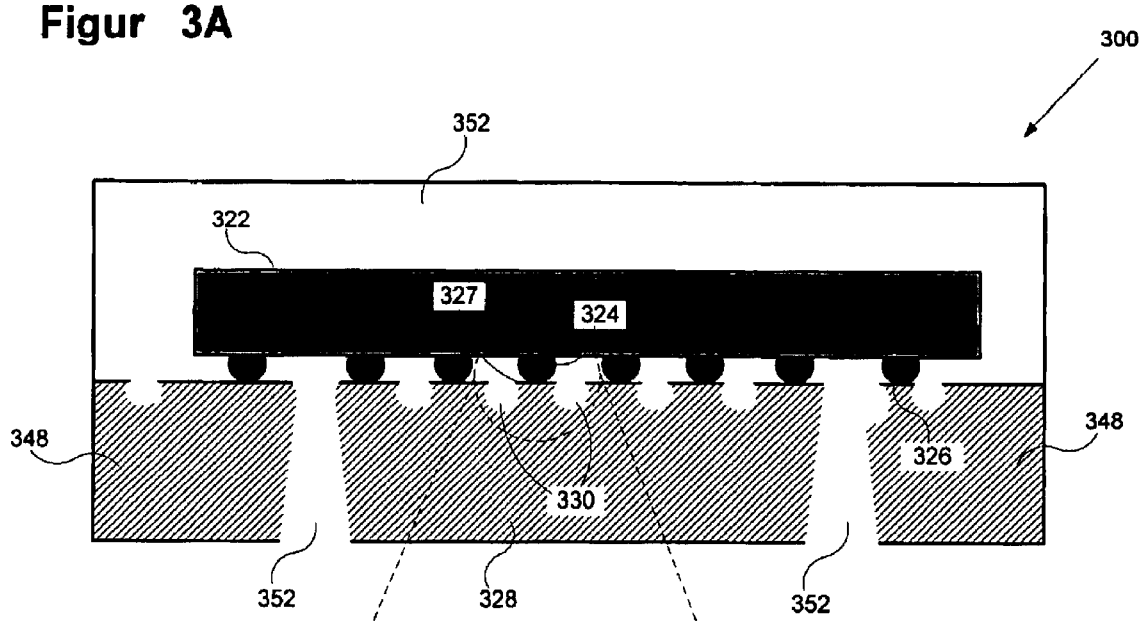
Figure 3B
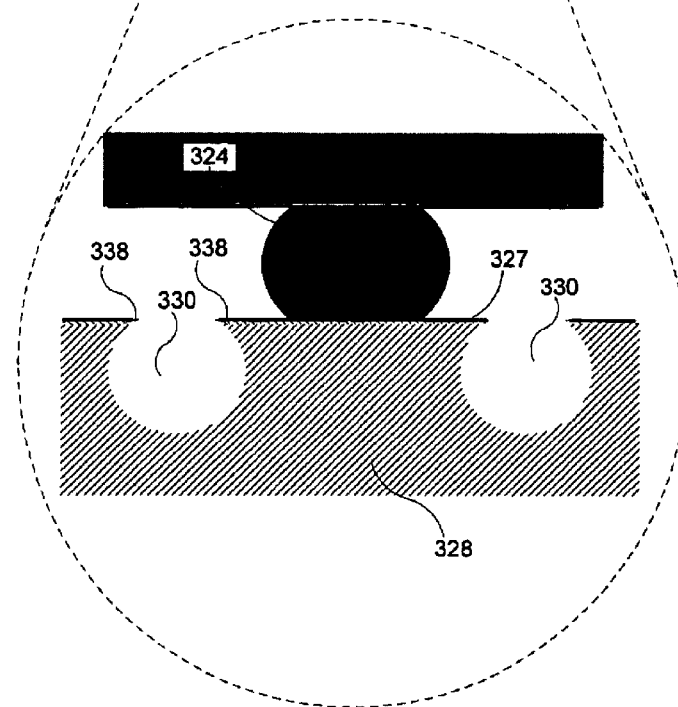

FLIP-CHIP LEADFRAME PACKAGE

BACKGROUND OF THE INVENTION

1. Field of the Invention

The present invention is generally in the field of semiconductor fabrication and more particularly in the field of semiconductor chip packaging.

2. Background Art

A leadframe is used, for example, in the fabrication of plastic molded enclosures, also referred to as a "molded package" or a "leadframe package" in the present application. The leadframe can be fabricated from a metal, for example, copper, and typically comprises a paddle which is secured to the body of the leadframe and typically situated at the center of the leadframe. The leadframe also comprises a number of leads which are secured to the frame. In an "exposed" paddle leadframe based molded package, the bottom of the paddle of the leadframe is left exposed in order to attach the bottom of the paddle to a printed circuit board.

Flip chip technology is a surface mount technology in which the semiconductor die is "flipped" over such that the active surface of the die faces downward to the interconnect substrate. Electrical contact between the active surface of the die and the interconnect substrate is achieved by utilizing an area array of small solder "bumps" that are planted on pads on the active surface of the die. After the die is placed faced down on the interconnect substrate, the temperature is increased and the solder in the flip chip solder bumps reflows, bonding the die directly to the interconnect on the substrate. As such, the die makes electrical and mechanical connection directly to the interconnect substrate without the use of bond wires. Flip chip technology provides a configuration that eliminates wire bonding and allows shorter interconnections between circuits and components, which results in thermal, electrical, and mechanical advantages. The solder reflow bonding process in flip chip fabrications is not always reliable, however, and the solder may flow outward from the pads and cause defects that can affect yield or performance.

Although flip chip technology is quite advantageous for applications with high heat dissipation and large pin counts, the process is complicated and expensive for low pin count specialty applications where high heat dissipation is desired. Such specialty chips may be in the form of small dies that may have only 10 pin-outs, versus over 100 pin-outs for larger or more complex dies, for example. Gallium arsenide (GaAs) power amplifier chips used in radio frequency (RF) applications are an example of low pin count devices that require a relatively high level of heat dissipation. Reliable performance, good heat dissipation, and low cost are critical factors in the design of RF devices. Two primary techniques currently exist for the fabrication of low pin count devices, although neither is free of considerable drawbacks.

One technique utilizes flip chip technology on a laminate substrate and the other utilizes a paddle with wire bonding. The first technique, i.e. flip chip on laminate, is shown in FIG. 1A. Flip chip on laminate employs a grid of solder bump pads on a laminate printed circuit board (PCB). Die 112 represents a die that has been flipped over and bonded onto laminate PCB 114 by solder bumps 110. FIG. 1B is a bottom view of die 112 as shown in FIG. 1A, illustrating the area array of solder bumps 110 on the active surface of the die. Since multiple layers of interconnect metal are required in PCB 114 for the numerous pin-out connections, vias 118 and 120 are exemplary vias used to reach respective layers of interconnect metal. Since laminate materials, e.g. bismaleimide triazine (BT) or BT impregnated glass weaves, used in PCB 114 are not good thermal conductors, the flip chip on laminate PCB has poor heat dissipation characteristics. The use of a laminate PCB is also expensive for low pin count applications.

The second technique utilizes a paddle instead of a laminate PCB, but uses wire bonding. Although the paddle exhibits good thermal conduction, the use of wire bonds introduces high electrical inductance and electrical resistance. Additionally, the wire bonding process does not produce optimal electrical contact and mechanical stability.

Thus there is need in the art for a low cost flip-chip package, with low thermal and electrical resistance and improved mechanical stability.

SUMMARY OF THE INVENTION

The present invention is directed to a structure for semiconductor die packaging. The invention overcomes the need in the art for a low cost flip-chip package, with low thermal and electrical resistance and improved mechanical stability.

According to one embodiment of the present invention, a leadframe includes at least one peripheral lead secured to a paddle. The leadframe can be fabricated from an electrically and thermally conductive metal such as copper. A paddle solder bump pad and a peripheral solder bump pad are respectively situated on the at least one peripheral lead and the paddle. A first recess is adjacent to the paddle solder bump pad and a second recess is adjacent to the peripheral solder bump pad. In one embodiment, the first and second recesses can be, for example, in the shape of rings encircling respectively the paddle solder bump pad and the peripheral solder bump pad. The first and second recesses can be fabricated, for example, by a chemical etch process.

In one embodiment, a semiconductor die having at least first and second solder bumps is situated on the leadframe such that the first solder bump is soldered to the paddle solder bump pad while the second solder bump is soldered to the peripheral solder bump pad. The first and second solder bumps can comprise, for example, tin or a tin/lead alloy.

The first and second recesses adjacent to respectively the paddle solder bump pad and the peripheral solder bump pad prevent solder from flowing out of the solder bump pad areas during solder reflow process. In this manner, the potential shorting of adjacent solder bump pads is prevented. Thus, the semiconductor die is electrically, mechanically, and thermally secured to the leadframe while resulting in a low cost flip-chip package, with low thermal and electrical resistance and improved mechanical stability.

BRIEF DESCRIPTION OF THE DRAWINGS

FIG. 1A shows a flip chip on a laminate printed circuit board.

FIG. 1B shows an area array of solder bumps on an active surface of a semiconductor die.

FIG. 3A shows a cross-sectional view of a leadframe package according to an exemplary embodiment of the present invention.

FIG. 3B shows an enlarged cross-sectional view of a recess around a solder bump pad in the leadframe package of FIG. 3A.

DETAILED DESCRIPTION OF THE INVENTION

The present invention is directed to a structure for semiconductor die packaging. The following description contains specific information pertaining to various embodiments and implementations of the invention. One skilled in the art will recognize that the present invention may be practiced in a manner different from that specifically discussed in the present application. Moreover, some of the specific details of the invention are not discussed in order not to obscure the invention. The specific details not described in the present application are within the knowledge of a person of ordinary skills in the art.

The drawings in the present application and their accompanying detailed description are directed to merely example embodiments of the invention. To maintain brevity, other embodiments of the invention that use the principles of the present invention are not specifically described in the present application and are not specifically illustrated by the present drawings.

Figure 2A:
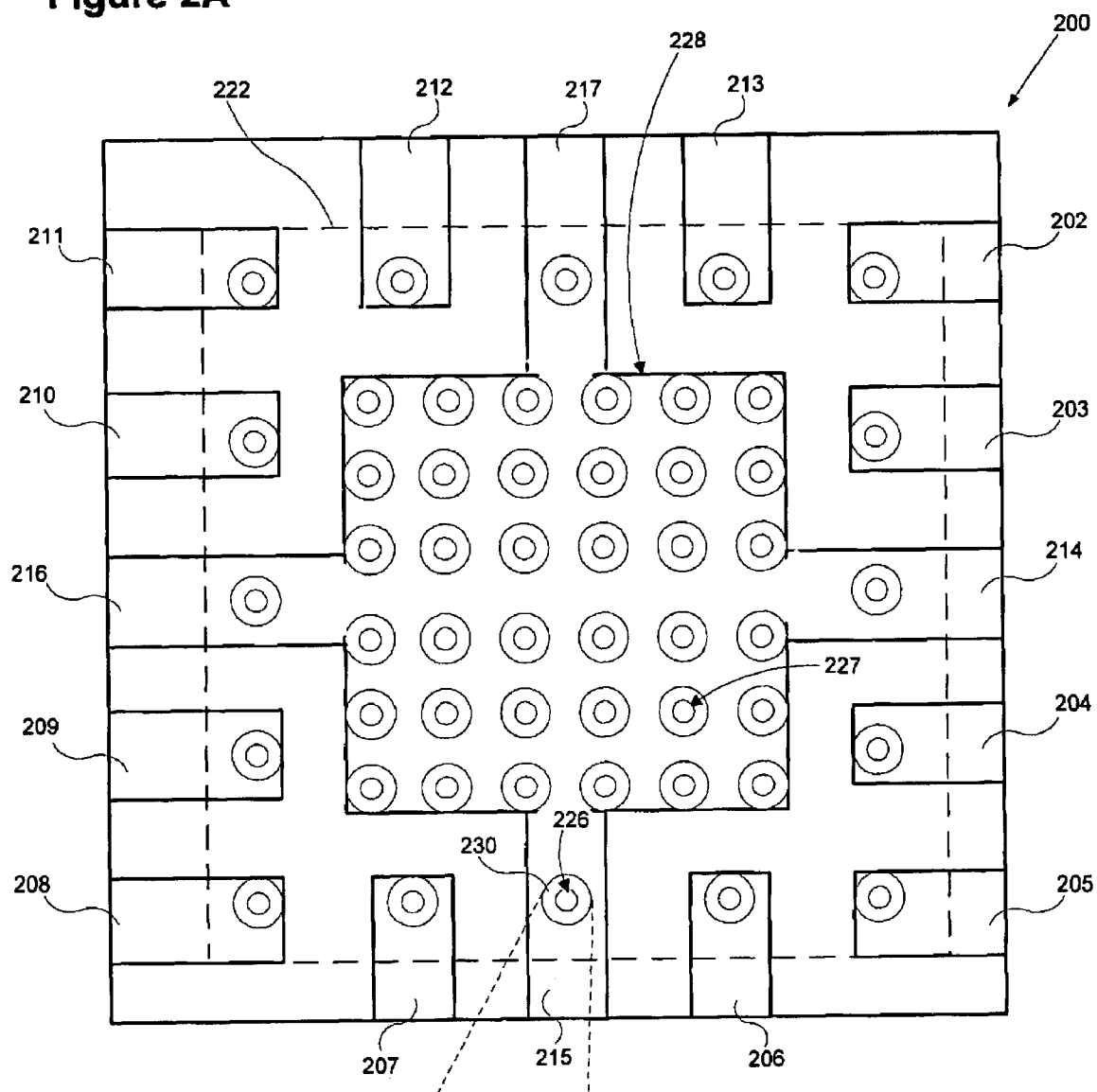
FIG. 2A shows a top view of an exemplary leadframe according to an embodiment of the present invention.

FIG. 2A shows a top view of exemplary leadframe 200 according to an embodiment of the present invention. Dashed line 222 indicates the area that will be occupied by a flipped die when it is mounted on leadframe 200. Exemplary leadframe 200 is typically fabricated from a metal such as copper and comprises sixteen peripheral leads 202, 203, 214, 204, 205, 206, 215, 207, 208, 209, 216, 210, 211, 212, 217, and 213 secured to paddle 228. In the present embodiment, paddle 228 is connected to electrical ground by leads 214, 215, 216, and 217, with each lead being located at the middle of each side of leadframe 200 as shown in FIG. 2A. In the present application, leads 214, 215, 216, and 217 may be referred to collectively as the "ground leads." In the present embodiment, the twelve remaining leads, i.e. leads 202, 203, 204, 205, 206, 207, 208, 209, 210, 211, 212, and 213 may be signal leads or $V_{dd}$ leads, for example. For ease of reference, in the present application, leads 202, 203, 204, 205, 206, 207, 208, 209, 210, 211, 212, and 213 may be referred to collectively as the "signal leads."

In the present embodiment, paddle 228 is covered by an area array of solder bump pads, such as solder bump pads 227 and 226, on which the flip chip solder bumps will make contact and will be attached in subsequent processing steps. Additionally, each of leads 202, 203, 214, 204, 205, 206, 215, 207, 208, 209, 216, 210, 211, 212, 217, and 213 has a solder bump pad on which the flip chip die can attach. For the purpose of brevity, each solder bump pad located on the peripheral leads of the leadframe 200, e.g. solder bump pad 226, will be termed "peripheral solder bump pad." Similarly, each solder bump pad located on paddle 228 of leadframe 200, e.g. solder bump pad 227, will be referred to as "paddle solder bump pad." For the purpose of brevity, the peripheral and paddle solder bump pads will be collectively referred to as "leadframe solder bump pads."

Although the leadframe solder bump pads may facilitate various functions, such as ground connection, signal connection, and power connection, and occupy various positions on leadframe 200, e.g. peripheral position or paddle position, they may be considered physically similar for purposes of discussion.

When the flipped die is mounted on leadframe 200, the array of solder bumps on the die will be aligned with the leadframe solder bump pads of leadframe 200. It should be noted that the following discussion of peripheral solder bump pad 226 can be applied to all the leadframe solder bump pads of leadframe 200. Surrounding peripheral solder bump pad 226, as well the other leadframe bump pads of leadframe 200, is a circular trench or ring-shaped recess that will be referred to as recess 230. In the present embodiment, recess 230 is in the shape of a circular trench, however, this is only exemplary and recess 230 may have other shapes.

Figure 2B:
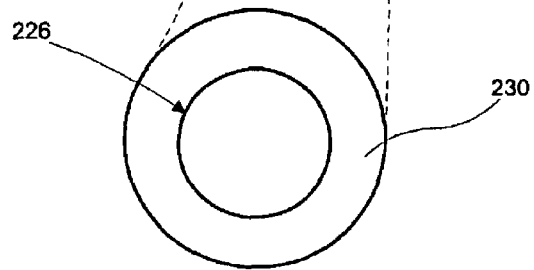
FIG. 2B shows an enlarged top view of an exemplary peripheral solder bump pad and a recess adjacent to the peripheral solder bump pad.

FIG. 2B shows an enlarged top view of exemplary peripheral solder bump pad 226 and recess 230 of peripheral lead 215. The inner circle in FIG. 2B is peripheral solder bump pad 226, while the ring around peripheral solder bump pad 226 is recess 230. As shown in FIGS. 3A and 3B, recess 230 is a partial etch through paddle 228.

FIG. 3A shows a cross-sectional view of leadframe package 300 according to an exemplary embodiment of the present invention. Leadframe package 300 corresponds to a later stage in the assembly process of leadframe 200 from FIG. 2A, i.e. after the flipped die has been mounted onto area 222 of FIG. 2A, and mold compound 352 has been applied to create a molded package. In the present embodiment, a semiconductor die, numbered as die 322, is attached to the top surface of paddle 328 and peripheral leads 348 using the flip chip method. The same polymeric mold compound, numbered as mold compound 352, provides both underfill (i.e. under die 322) and encapsulation (i.e. above die 322) in leadframe package 300. In the present invention, semiconductor die 322 might be a high power device such as a gallium arsenide ("GaAs") power amplifier.

Mold compound 352 may be a material with high thermal conductivity and high electrical resistivity, such as a G700 biphenyl mold compound, for example. Die 322 is attached to the surface of paddle 328 and leads 348 by solder bumps 324. Solder bumps 324 attach to the paddle solder bump pads, e.g. paddle solder bump pad 327, and the peripheral solder bump pads, e.g. peripheral solder bump pad 326, as shown in leadframe package 300. It should be noted that recess 330 in leadframe package 300 of FIG. 3A corresponds to a cross-sectional view of exemplary recess 230 in leadframe 200 of FIG. 2A.

An enlarged cross-sectional view of recess 330 around solder bump pad 327 is shown in FIG. 3B. As previously mentioned, recess 330 is a ring-shaped trench that is formed around each leadframe solder bump pad. Recess 330 may be formed by a chemical etch process, for example. During the solder reflow process, solder bump 324, which typically comprises tin or a tin/lead alloy, becomes a liquid mass and may flow or spread outward beyond the area of paddle solder bump pad 327. The spreading of liquid solder from solder bump 324 to a neighboring paddle solder bump pad on paddle 328, for example, may cause a short circuit. To prevent the undesirable spreading of liquid solder from solder bump 324, recess 330 physically contains the liquid solder from flowing over to neighboring pads. The geometry of recess 330 is such that the walls of recess 330 meet the surface of paddle 328 to form lip 338. Lip 338 helps contain any reflowing solder that may be spreading out from paddle solder bump pad 327. It is noted that the above discussion is applicable to peripheral solder bump pads, such as peripheral solder bump pad 326, as well as to paddle solder bump pads, such as paddle solder bump pad 327, which was specifically discussed above.

The configuration of exemplary leadframe package 300 shown in FIG. 3A offers several advantages over the existing methods of fabricating packages for low pin count RF chips. One of the advantages is that leadframe package 300 does not use a laminate PCB structure as commonly used in flip chip designs. Laminate PCB materials are typically both expensive and poor thermal conductors, whereas leadframe 200 (FIG. 2) used in leadframe package 300 comprises an inexpensive metal with high thermal conductivity.

Another existing method utilizes a leadframe paddle such as paddle 228 (FIG. 2), but uses wire bonding instead of flip chip technology. Although the paddle has high thermal conductivity and provides good heat dissipation in such a design, the wire bonds create a considerable amount of electrical inductance and resistance. The flip chip bonding approach shown in leadframe package 300 also provides superior electrical contact and mechanical stability compared to wire bonding methods.

It is appreciated by the above detailed description that the present invention provides a structure for semiconductor die packaging. From the above description of the invention it is manifest that various techniques can be used for implementing the concepts of the present invention without departing from its scope. Moreover, while the invention has been described with specific reference to certain embodiments, a person of ordinary skills in the art would appreciate that changes can be made in form and detail without departing from the spirit and the scope of the invention. The described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a structure for semiconductor die packaging has been described.

What is claimed is:

1. A structure comprising:
   a leadframe comprising a leadframe solder bump pad;
   an unshared recess surrounding said leadframe solder bump pad; and
   a semiconductor die having a solder bump, said solder bump being attached to said leadframe solder bump pad.

2. The structure of claim 1 wherein said structure is encapsulated in a mold compound.

3. The structure of claim 2 wherein said mold compound is an underfill in said structure.

4. The structure of claim 1 wherein said leadframe comprises copper.

5. The structure of claim 1 wherein said unshared recess is formed by a chemical etch process.

6. The structure of claim 1 wherein said unshared recess prevents flow of solder beyond said leadframe solder bump pad.

7. The structure of claim 1 wherein said solder bump comprises material selected from the group consisting of tin and a tin/lead alloy.

8. The structure of claim 1 wherein said semiconductor die comprises a GaAs power amplifier.

9. The structure of claim 2 wherein said mold compound comprises a biphenyl mold compound.

10. A structure comprising:
    a leadframe comprising a paddle and a peripheral lead;
    a paddle solder bump pad on said paddle;
    a peripheral solder bump pad on said peripheral lead;
    a first unshared recess surrounding said paddle solder bump pad; and
    a second unshared recess surrounding said peripheral solder bump pad.

11. The structure of claim 10 further comprising a semiconductor die having a first solder bump attached to said paddle solder bump pad.

12. The structure of claim 11 wherein said semiconductor die comprises a second solder bump attached to said peripheral solder bump pad.

13. The structure of claim 10 wherein said structure is encapsulated in a mold compound.

14. The structure of claim 13 wherein said mold compound is an underfill in said structure.

15. The structure of claim 10 wherein said leadframe comprises copper.

16. The structure of claim 10 wherein said first and second unshared recesses are formed by a chemical etch process.

17. The structure of claim 10 wherein said first unshared recess prevents flow of solder beyond said paddle solder bump pad and wherein said second unshared recess prevents flow of solder beyond said peripheral solder bump pad.

18. The structure of claim 12 wherein said first and second solder bumps comprise material selected from the group consisting of tin and a tin/lead alloy.

19. The structure of claim 12 wherein said semiconductor die comprises a GaAs power amplifier.

20. The structure of claim 13 wherein said mold compound comprises a biphenyl mold compound.

21. A structure comprising:
    a leadframe comprising a plurality of leadframe solder bump pads;
    an unshared respective recess surrounding each of said plurality of leadframe solder bump pads;
    a semiconductor die having a plurality of solder bumps, each of said plurality of solder bumps being attached to a respective one of said plurality of leadframe solder bump pads.

22. The structure of claim 21 wherein said unshared respective recess prevents flow of solder beyond said respective one of said plurality of leadframe solder bump pads.

23. The structure of claim 21 wherein said unshared respective recess is formed by a chemical etch process.

24. The structure of claim 21 wherein said structure is encapsulated in a mold compound.

25. The structure of claim 24 wherein said mold compound is an underfill in said structure.

26. The structure of claim 24 wherein said mold compound comprises a biphenyl mold compound.

27. The structure of claim 21 wherein said semiconductor die comprises a GaAs power amplifier.

28. The structure of claim 21 wherein said leadframe comprises copper.

29. The structure of claim 21 wherein said each of said plurality of solder bumps comprises material selected from the group consisting of tin and a tin/lead alloy.

\* \* \* \* \*